(12) United States Patent
Kim et al.

(10) Patent No.: US 10,861,385 B2
(45) Date of Patent: Dec. 8, 2020

(54) DISPLAY DEVICE INCLUDING PIXELS WITH DRIVING TRANSISTORS THAT HAVE DIFFERENT AMOUNTS OF UNIT TRANSISTORS

(71) Applicant: SAMSUNG DISPLAY CO., LTD., Yongin-si (KR)

(72) Inventors: Dong Won Kim, Seoul (KR); Sung Ho Kim, Suwon-si (KR); Jong Moo Huh, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 226 days.

(21) Appl. No.: 15/155,165

(22) Filed: May 16, 2016

(65) Prior Publication Data

US 2017/0047003 A1 Feb. 16, 2017

(30) Foreign Application Priority Data

Aug. 12, 2015 (KR) ........................ 10-2015-0113698

(51) Int. Cl.
*G09G 3/3233* (2016.01)
*G09G 3/3225* (2016.01)
(Continued)

(52) U.S. Cl.
CPC ......... *G09G 3/3233* (2013.01); *G09G 3/3225* (2013.01); *H01L 27/1222* (2013.01);
(Continued)

(58) Field of Classification Search
CPC ...... G09G 3/3233; G09G 3/3241; G09G 3/00; G09G 3/3283; G09G 3/3266; H05B 33/00;
(Continued)

(56) References Cited

U.S. PATENT DOCUMENTS 6,501,448 B1 * 12/2002 Komiya ............... G09G 3/3233
345/80
2003/0164685 A1 * 9/2003 Inukai .................. G09G 3/3283
315/169.3
(Continued)

FOREIGN PATENT DOCUMENTS

JP 2010-266490 11/2010
KR 1020060022414 3/2006
(Continued)

*Primary Examiner* — Jennifer Mehmood
*Assistant Examiner* — James S Nokham
(74) *Attorney, Agent, or Firm* — F. Chau & Associates, LLC

(57) ABSTRACT

A display device includes: a first pixel including a first organic light emitting diode and a first driving transistor for controlling a driving current flowing to the first organic light emitting diode; a second pixel including a second organic light emitting diode and a second driving transistor for controlling a driving current flowing to the second organic light emitting diode; and a third pixel including a third organic light emitting diode and a third driving transistor for controlling a driving current flowing to the third organic light emitting diode, wherein the first driving transistor, the second driving transistor, and the third driving transistor include a different number of unit transistors from one another, and the first pixel, the second pixel, and the third pixel have different colors from one another.

12 Claims, 15 Drawing Sheets

(51) Int. Cl.
*H01L 27/32* (2006.01)
*H01L 29/786* (2006.01)
*H01L 27/12* (2006.01)

(52) U.S. Cl.
CPC ...... *H01L 27/3262* (2013.01); *H01L 29/7869* (2013.01); *G09G 2300/0452* (2013.01); *G09G 2300/0809* (2013.01); *G09G 2300/0819* (2013.01); *H01L 27/124* (2013.01); *H01L 27/1225* (2013.01)

(58) Field of Classification Search
CPC ............. H01L 27/1255; H01L 27/1285; H01L 27/3262
See application file for complete search history.

(56) References Cited

U.S. PATENT DOCUMENTS

| | | | | | |
|---|---|---|---|---|---|
| 2003/0205973 | A1* | 11/2003 | Park | ................... | G09G 3/3233 315/169.1 |
| 2004/0130262 | A1* | 7/2004 | Yoneda | ............... | H01L 27/3262 313/500 |
| 2004/0246209 | A1* | 12/2004 | Sung | ................... | G09G 3/3233 345/76 |
| 2004/0251953 | A1* | 12/2004 | Yamazaki | ............. | F21V 23/001 327/512 |
| 2006/0061525 | A1* | 3/2006 | Kim | ..................... | G09G 3/3233 345/76 |
| 2006/0066530 | A1* | 3/2006 | Azami | ................. | G09G 3/3266 345/76 |
| 2006/0284182 | A1* | 12/2006 | Yoon | ................... | H01L 27/1285 257/72 |
| 2007/0052634 | A1* | 3/2007 | Yamazaki | ............ | G09G 3/3233 345/76 |
| 2007/0080918 | A1* | 4/2007 | Kawachi | ............. | G09G 3/3233 345/92 |
| 2007/0200802 | A1* | 8/2007 | Kasai | ................... | G09G 3/3241 345/76 |
| 2008/0017866 | A1* | 1/2008 | Sato | .................... | H01L 27/3262 257/72 |
| 2011/0043513 | A1* | 2/2011 | Yamazaki | ............ | G09G 3/3233 345/212 |
| 2012/0056904 | A1* | 3/2012 | Lhee | .................... | G09G 3/3233 345/690 |
| 2013/0032806 | A1* | 2/2013 | Kimura | ............... | H01L 27/1255 257/59 |

FOREIGN PATENT DOCUMENTS

| | | |
|---|---|---|
| KR | 1020060029549 | 4/2006 |
| KR | 1020060093749 | 8/2006 |
| KR | 1020100000638 | 1/2010 |
| KR | 1020110117355 | 10/2011 |

* cited by examiner

DISPLAY DEVICE INCLUDING PIXELS WITH DRIVING TRANSISTORS THAT HAVE DIFFERENT AMOUNTS OF UNIT TRANSISTORS

CROSS-REFERENCE TO RELATED APPLICATION

This application claims priority under 35 U.S.C. § 119 to Korean Patent Application No. 10-2015-0113698 filed in the Korean Intellectual Property Office on Aug. 12, 2015, the disclosure of which is incorporated by reference herein in its entirety.

TECHNICAL FIELD

An exemplary embodiment of the present invention relates to a display device, and more particularly, to a display device including an oxide thin film transistor.

DESCRIPTION OF THE RELATED ART

In general, a display device includes a display area including a plurality of pixels arranged in a matrix format. The display area includes a plurality of gate lines extended in a row direction and a plurality of data lines extended in a column direction. The plurality of gate lines intersect the plurality of data lines. Each of the plurality of pixels is connected to a gate line and a data line, and includes at least one thin film transistor (TFT) that is driven by a gate signal transmitted from the gate line and a data voltage transmitted from the data line.

The TFT may be an oxide TFT which uses an oxide semiconductor as a channel material. However, certain characteristics of an oxide TFT may be changed due to the channel size.

Such changes may be detrimental to a display device including the oxide TFT.

SUMMARY

An exemplary embodiment of the present invention provides a display device, including: a first pixel including a first organic light emitting diode and a first driving transistor for controlling a first driving current flowing to the first organic light emitting diode; a second pixel including a second organic light emitting diode and a second driving transistor for controlling a second driving current flowing to the second organic light emitting diode; and a third pixel including a third organic light emitting diode and a third driving transistor for controlling a third driving current flowing to the third organic light emitting diode, wherein the first driving transistor, the second driving transistor, and the third driving transistor include a different number of unit transistors from one another, and the first pixel, the second pixel, and the third pixel have different colors from one another.

The unit transistor may have a channel of a predetermined width and length.

The first driving transistor may include two unit transistors each including a gate electrode connected to a first node.

The two unit transistors included in the first driving transistor may form one current path between a first power source voltage and the first organic light emitting diode.

The first pixel may further include a switching transistor for transmitting a data voltage to the first node, and the switching transistor includes one unit transistor.

The second driving transistor may include four unit transistors each including a gate electrode connected to a second node.

The four unit transistors included in the second driving transistor may form two current paths between the first power source voltage and the second organic light emitting diode.

First and second unit transistors of the four unit transistors may form a first current path between the first power source voltage and the second organic light emitting diode, and third and fourth unit transistors of the four unit transistors may form a second current path between the first power source voltage and the second organic light emitting diode.

The second pixel may further include a switching transistor for transmitting a data voltage to the second node, and the switching transistor includes one unit transistor.

The third driving transistor may include six unit transistors each including a gate electrode connected to a third node.

The six unit transistors included in the third driving transistor may form three current paths between the first power source voltage and the third organic light emitting diode.

First and second unit transistors of the six unit transistors may form a first current path between the first power source voltage and the third organic light emitting diode, third and fourth unit transistors of the six unit transistors may form a second current path between the first power source voltage and the third organic light emitting diode, and fifth and sixth unit transistors of the six unit transistors may form a third current path between the first power source voltage and the third organic light emitting diode.

The third pixel may further include a switching transistor for transmitting a data voltage to the third node, and the switching transistor includes one unit transistor.

The first organic light emitting diode may emit red light, the second organic light emitting diode may emit green light, and the third organic light emitting diode may emit blue light.

The first pixel may include a light emitting transistor for transmitting the first driving current to the first organic light emitting diode. The second pixel may include a light emitting transistor for transmitting the second driving current to the second organic light emitting diode. The third pixel may include a light emitting transistor for transmitting the third driving current to the third organic light emitting diode.

Each of the light emitting transistors may include five unit transistors each including a gate electrode applied with a light emission control signal.

The five unit transistors may form five current paths.

The unit transistor may be an oxide thin film transistor.

At least one of the first driving transistor, the second driving transistor, the third driving transistor, and the light emitting transistor may be a p-channel field effect transistor.

An exemplary embodiment of the present invention provides a display device, including: a first pixel including a first light emitting element and a first driving transistor for providing a driving current to the first light emitting element; a second pixel including a second light emitting element and a second driving transistor for providing a driving current to the second light emitting element; and a third pixel including a third light emitting element and a third driving transistor for providing a driving current to the third light emitting element, wherein the first to third driving transistors include a different number of unit transistors from one another and the unit transistors each have the same channel width and length.

DETAILED DESCRIPTION OF THE EMBODIMENTS

Figure 1:
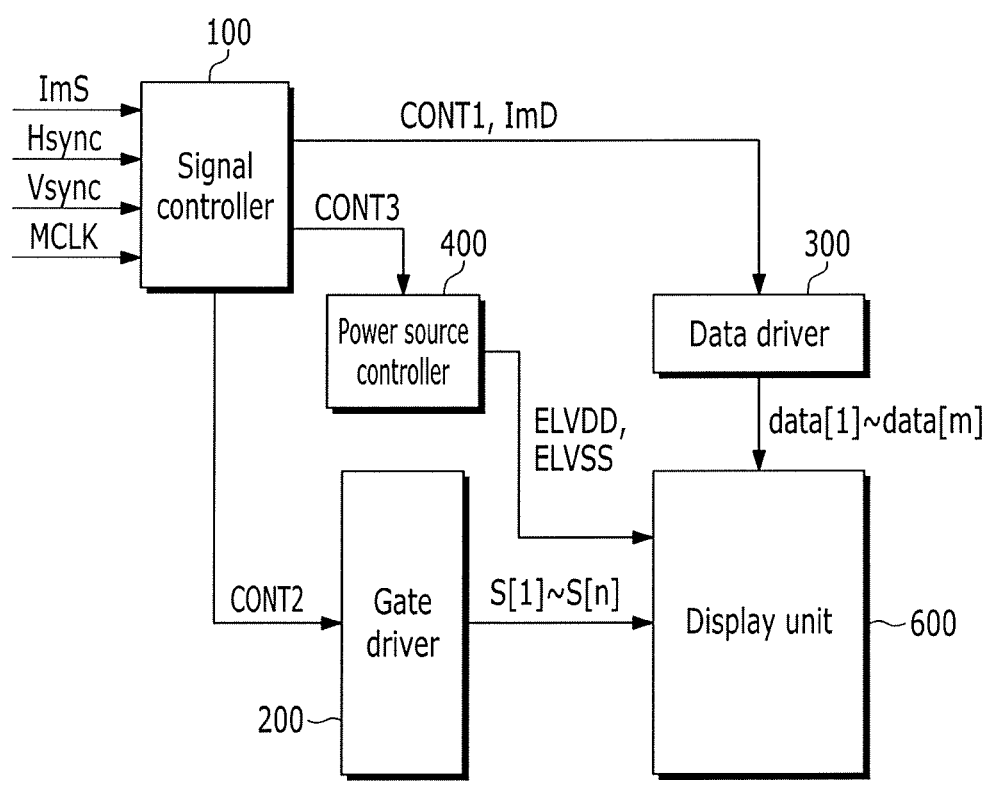
FIG. 1 illustrates a display device according to an exemplary embodiment of the present invention.

Hereinafter, the present invention will be described more fully with reference to the accompanying drawings, in which exemplary embodiments of the invention are shown. As those skilled in the art would realize, the described embodiments may be modified in various different ways, and thus, should not be limited to the embodiments set forth herein.

Further, in the exemplary embodiments disclosed herein, since like reference numerals designate like elements having the same configuration, a first exemplary embodiment is representatively described, and in other exemplary embodiments, only a configuration different from the first exemplary embodiment will be described.

Throughout this specification and the claims that follow, when it is described that an element is "coupled" to another element, the element may be "directly coupled" to the other element or "electrically coupled" to the other element through a third element.

FIG. 1 illustrates a display device according to an exemplary embodiment of the present invention.

Referring to FIG. 1, a display device includes a signal controller 100, a gate driver 200, a data driver 300, a power source controller 400, and a display unit 600.

The signal controller 100 receives a video signal ImS and a synchronization signal that are input from an external device. The video signal ImS contains luminance information of a plurality of pixels. Luminance has gray levels of a determined number, for example, 1024 ($=2^{10}$), 256 ($=2^8$), or 64 ($=2^6$). The synchronization signal includes a horizontal synchronization signal Hsync, a vertical synchronization signal Vsync, and a main clock signal MCLK.

The signal controller 100 generates first to third driving control signals CONT1, CONT2, and CONT3 and image data ImD according to the video signal ImS, the horizontal synchronization signal Hsync, the vertical synchronization signal Vsync, and the main clock signal MCLK.

The signal controller 100 divides the video signal ImS in a frame unit according to the vertical synchronization signal Vsync, divides the video signal ImS in a scan line unit according to the horizontal synchronization signal Hsync, and generates the image data ImD. The signal controller 100 transmits the image data ImD together with the first driving control signal CONT1 to the data driver 300.

The display unit 600 includes a plurality of scan lines that are extended in an approximate row direction to be almost parallel to each other, a plurality of data lines that are extended in an approximate column direction to be almost parallel to each other, and a plurality of pixels arranged in an almost matrix form in areas where the scan lines intersect the data lines.

The gate driver 200 generates a plurality of gate signals S[1]-S[n] according to the second driving control signal CONT2. The gate driver 200 is connected to a plurality of gate lines, and sequentially applies the gate signals S[1]-S[n] of a gate-on voltage to the plurality of gate lines.

The data driver 300 samples and holds the input image data ImD according to the first driving control signal CONT1, and generates a plurality of data voltages data[1]-data[m]. The data driver 300 is connected to a plurality of data lines, and transfers the plurality of data voltages data[1]-data[m] to the plurality of data lines. The data driver 300 applies the data voltages data[1]-data[m] having a predetermined voltage range to the data lines corresponding to the gate signals S[1]-S[n] of a gate-on voltage.

The power source controller 400 supplies a first power source voltage ELVDD and a second power source voltage ELVSS to the plurality of pixels included in the display unit 600. The power source controller 400 controls a power supply level of the first power source voltage ELVDD and the second power source voltage ELVSS according to the third driving control signal CONT3. The first power source voltage ELVDD and the second power source voltage ELVSS supply a driving current for the pixels of the display unit 600.

Each of the pixels included in the display unit 600 may emit light of one of the primary colors. An example of the primary colors may include red, green, and blue. A desired color may be displayed with a spatial sum or a temporal sum of the primary colors. A pixel emitting red light is a red pixel, a pixel emitting green light is a green pixel, and a pixel emitting blue light is a blue pixel.

Herein, the primary colors of red, green, and blue are exemplified, but the primary colors are not limited thereto. For example, a plurality of pixels may emit one of yellow, cyan, and magenta as the primary colors. The plurality of pixels may emit a color mixture of the primary colors or a white color.

Figure 2:
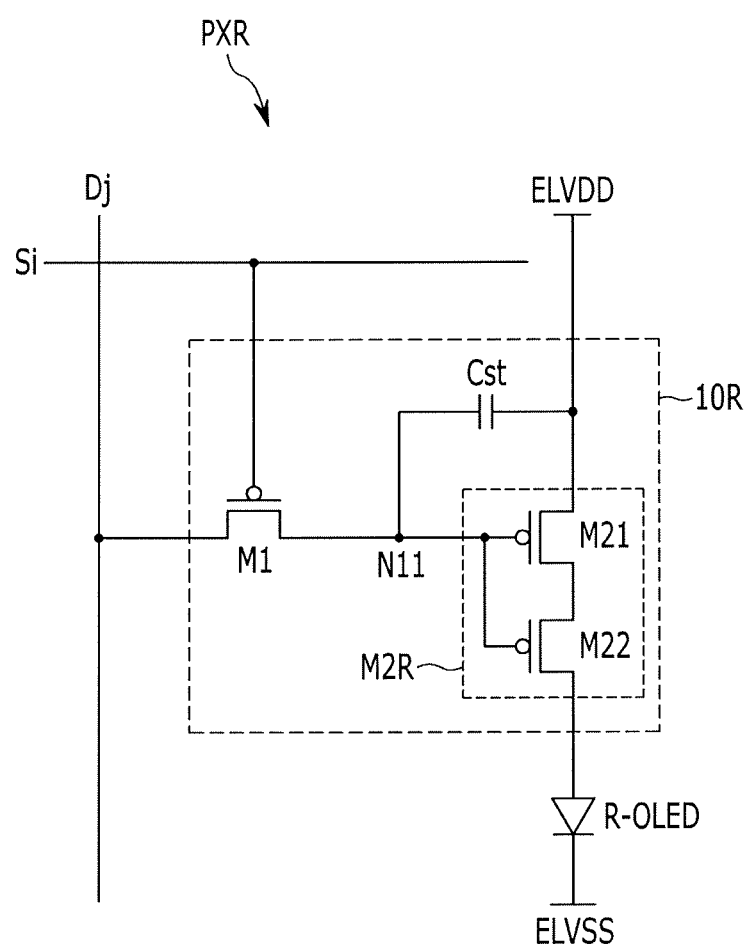
FIG. 2 illustrates a first pixel included in the display device of FIG. 1 according to an exemplary embodiment of the present invention.

Hereafter, the plurality of pixels included in the display unit 600 are exemplified to include the red pixels, the green pixels, and the blue pixels FIG. 2 illustrates a first pixel included in the display device of FIG. 1 according to an exemplary embodiment of the present invention. A first pixel PXR may be a red pixel for emitting red light of the plurality of pixels included in the display unit 600 of FIG. 1.

Referring to FIG. 2, the first pixel PXR includes a first organic light emitting diode R-OLED and a first pixel circuit 10R.

The first pixel circuit 10R includes a switching transistor M1, a first driving transistor M2R, and a sustain capacitor Cst.

The switching transistor M1 includes a gate electrode connected to a gate line Si, a first electrode connected to a data line Dj, and a second electrode connected to a first node N11. The switching transistor M1 turns on by a gate signal of the gate-on voltage applied to the gate line Si, and transmits a data voltage applied to the data line Dj to the first node N11.

The first driving transistor M2R includes two unit transistors M21 and M22 which have gate electrodes connected to the first node N11. In other words, the first driving transistor M2R includes a first unit transistor M21 and a second unit transistor M22. The first unit transistor M21 includes a gate electrode connected to the first node N11, a first electrode connected to a first power source voltage ELVDD, and a second electrode connected to a first electrode of the second unit transistor M22. The second unit transistor M22 includes a gate electrode connected to the first node N11, a first electrode connected to the second electrode of the first unit transistor M21, and a second electrode connected to the first organic light emitting diode R-OLED. The first unit transistor M21 and the second unit transistor M22 are turned on by a voltage of the first node N11, and form a current path between the first power source voltage ELVDD and the first organic light emitting diode R-OLED. In this case, the first and second unit transistors M21 and M22 control a driving current flowing from the first power source voltage ELVDD to the first organic light emitting diode R-OLED.

The unit transistor is a transistor having a channel of a predetermined uniform width and length. In other words, the first unit transistor M21 and the second unit transistor M22 have channels of the predetermined uniform width and length. A width and length of the channel of the first unit transistor M21 are equal to a width and length of the channel of the second unit transistor M22, and the first unit transistor M21 and the second unit transistor M22 have substantially equivalent characteristics. The switching transistor M1 may have a channel having a same width and length as the channels of the first unit transistor M21 and the second unit transistor M22. In other words, the switching transistor M1 may be one of the unit transistors. The unit transistor will also be described in reference to FIGS. 5 to 8.

The sustain capacitor Cst includes a first electrode connected to the first node N11 and a second electrode connected to the first power source voltage ELVDD. The sustain capacitor Cst sustains the data voltage applied to the first node N11 after the switching transistor M1 is turned off.

The first organic light emitting diode R-OLED includes an anode electrode connected to the first driving transistor M2R and a cathode electrode connected to the second power source voltage ELVSS. The first organic light emitting diode R-OLED may emit red light when a driving current flows through the first driving transistor M2R.

The switching transistor M1 and the first driving transistor M2R may be oxide thin film transistors. For example, the unit transistors M21 and M22 included in the first driving transistor M2R may be oxide thin film transistors. The oxide semiconductor of an oxide thin film transistor may include one of an oxide based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are composite oxides thereof.

The switching transistor M1 and the first driving transistor M2R may be p-channel field effect transistors. In this case, a gate-on voltage that turns on the switching transistor M1 and the first driving transistor M2R is a low level voltage, and a gate-off voltage that turns off the switching transistor M1 and the first driving transistor M2R is a high level voltage.

Here, a p-channel field effect transistor is illustrated, but at least one of the switching transistor M1 and the first driving transistor M2R may be an n-channel field effect transistor. In this case, a gate-on voltage that turns on the n-channel field effect transistor is a high level voltage, and a gate-off voltage that turns off the n-channel field effect transistor is a low level voltage.

Figure 3:
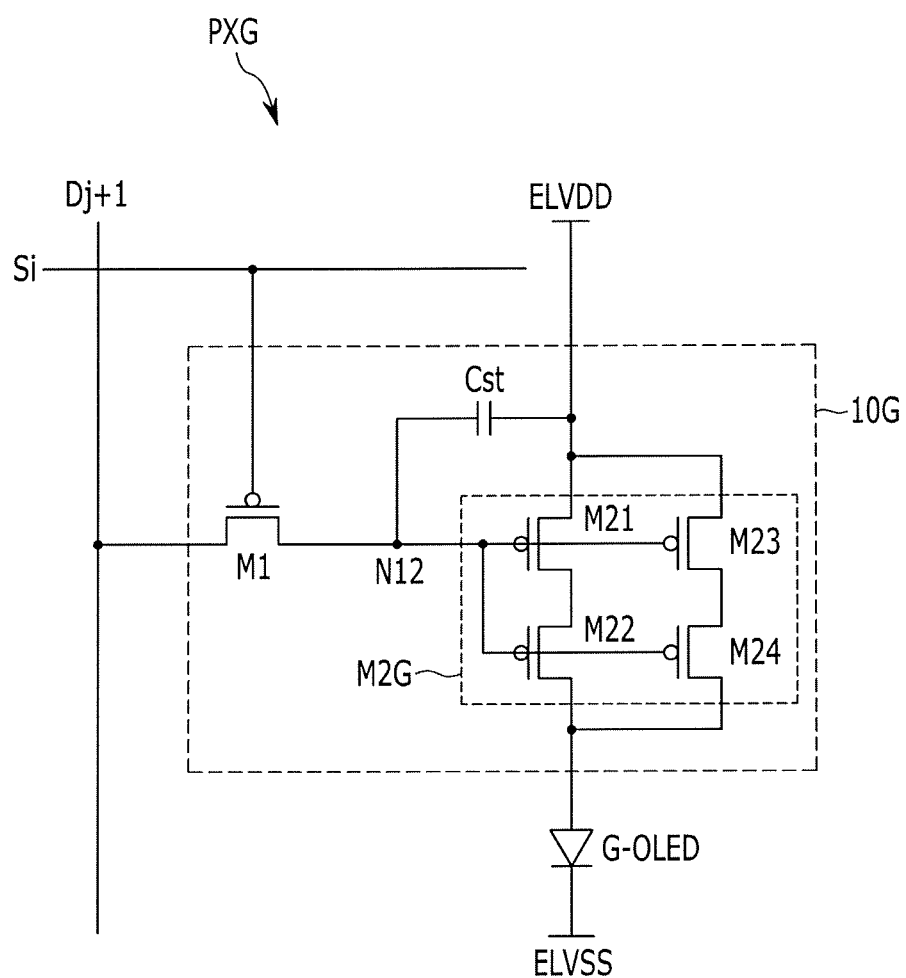
FIG. 3 illustrates a second pixel included in the display device of FIG. 1 according to an exemplary embodiment of the present invention.

FIG. 3 illustrates a second pixel included in the display device of FIG. 1 according to an exemplary embodiment of the present invention. A second pixel PXG may be a green pixel for emitting green light of the plurality of pixels included in the display unit 600 of FIG. 1.

Referring to FIG. 3, the second pixel PXG includes a second organic light emitting diode G-OLED and a second pixel circuit 10G.

The second pixel circuit 10G includes a switching transistor M1, a second driving transistor M2G, and a sustain capacitor Cst.

The switching transistor M1 includes a gate electrode connected to a gate line Si, a first electrode connected to a data line Dj+1, and a second electrode connected to a second node N12. The sustain capacitor Cst includes a first electrode connected to the second node N12, and a second electrode connected to the first power source voltage ELVDD. The switching transistor M1 and the sustain capacitor Cst are substantially equivalent to those described in FIG. 2, and thus, like reference numerals are designated.

The second driving transistor M2G includes four unit transistors M21, M22, M23, and M24 which have gate electrodes connected to the second node M12. In other words, the second driving transistor M2G includes a first unit transistor M21, a second unit transistor M22, a third unit transistor M23, and a fourth unit transistor M24. As compared with the first driving transistor M2R of FIG. 2, the second driving transistor M2G further includes the third unit transistor M23 and the fourth unit transistor M24. The third unit transistor M23 includes a gate electrode connected to the second node N12, a first electrode connected to the first power source voltage ELVDD, and a second electrode connected to a first electrode of the fourth unit transistor M24. The fourth unit transistor M24 includes a gate electrode connected to the second node N12, a first electrode connected to the second electrode of the third unit transistor M23, and a second electrode connected to the second organic light emitting diode G-OLED. The first unit transistor M21 to the fourth unit transistor M24 are turned on by a voltage of the second node N12, and form two current paths between the first power source voltage ELVDD and the second organic light emitting diode G-OLED. In this case, the first to fourth unit transistors M21 to M24 control a driving current flowing from the first power source voltage ELVDD to the second organic light emitting diode G-OLED. In other words, the first unit transistor M21 and the second unit transistor M22 form a first current path between the first power source voltage ELVDD and the second organic light emitting diode G-OLED, and the third unit transistor M23 and the fourth unit transistor M24 form a second current path between the first power source voltage ELVDD and the second organic light emitting diode G-OLED.

A width and length of channels of each of the first unit transistor M21 to the fourth unit transistor M24 are equal, and the first unit transistor M21 to the fourth unit transistor M24 have substantially equivalent characteristics.

The second organic light emitting diode G-OLED includes an anode electrode connected to the second driving transistor M2G, and a cathode electrode connected to the second power source voltage ELVSS. The second organic light emitting diode G-OLED may emit green light when a driving current flows through the second driving transistor M2G.

The switching transistor M1 and the second driving transistor M2G may be oxide thin film transistors. The switching transistor M1 and the second driving transistor M2G may be p-channel field effect transistors. In addition, at least one of the switching transistor M1 and the second driving transistor M2G may be an n-channel field effect transistor.

Figure 4:
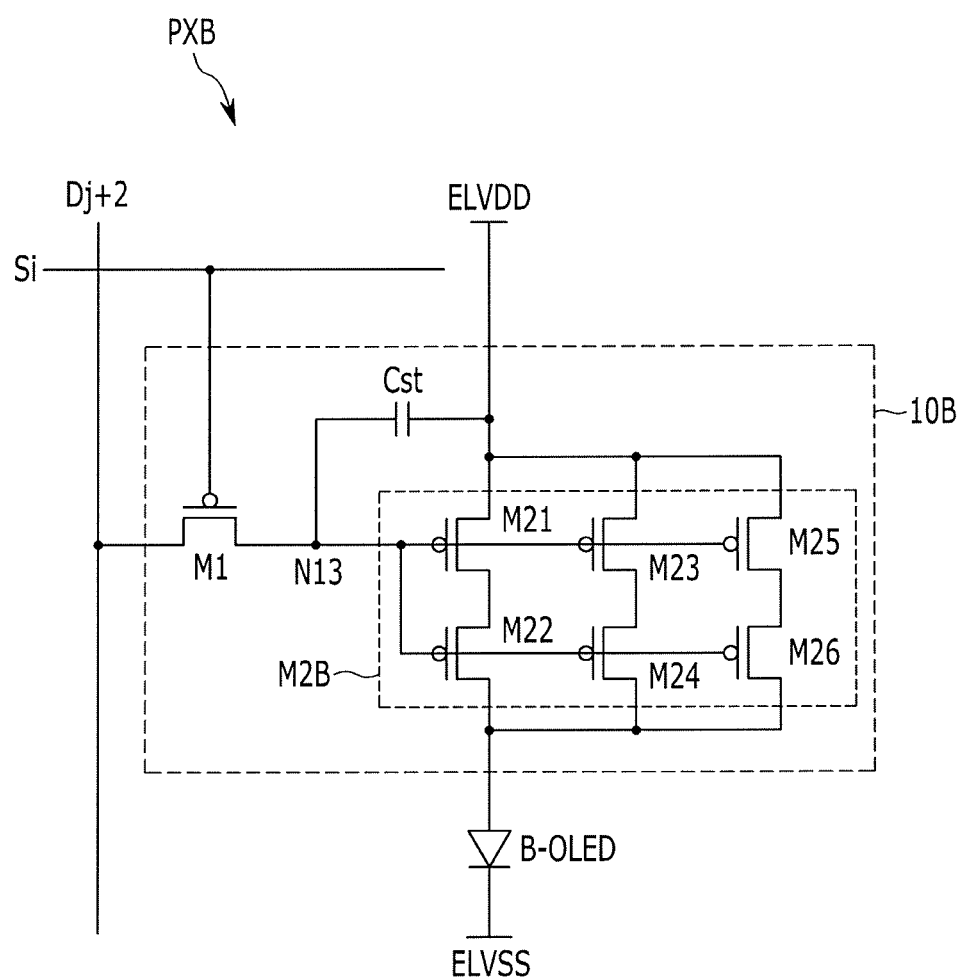
FIG. 4 illustrates a third pixel included in the display device of FIG. 1 according to an exemplary embodiment of the present invention.

FIG. 4 illustrates a third pixel included in the display device of FIG. 1 according to an exemplary embodiment of the present invention. A third pixel PXB may be a blue pixel for emitting blue light of the plurality of pixels included in the display unit 600 of FIG. 1.

Referring to FIG. 4, the third pixel PXB includes a third organic light emitting diode B-OLED and a third pixel circuit 10B.

The third pixel circuit 10B includes a switching transistor M1, a third driving transistor M2B, and a sustain capacitor Cst.

The switching transistor M1 includes a gate electrode connected to a gate line Si, a first electrode connected to a data line Dj+2, and a second electrode connected to a third node N13. The sustain capacitor Cst includes a first electrode connected to the third node N13 and a second electrode connected to the first power source voltage ELVDD. The switching transistor M1 and the sustain capacitor Cst are substantially equivalent to those described in FIG. 2, and thus, like reference numerals are designated.

The third driving transistor M2B includes six unit transistors M21, M22, M23, M24, M25, and M26 which have gate electrodes connected to the third node M13. In other words, the third driving transistor M2B includes a first unit transistor M21, a second unit transistor M22, a third unit transistor M23, a fourth unit transistor M24, a fifth unit transistor M25, and a sixth unit transistor M26. As compared with the second driving transistor M2G of FIG. 3, the third driving transistor M2B further includes the fifth unit transistor M25 and the sixth unit transistor M26. The fifth unit transistor M25 includes a gate electrode connected to the third node N13, a first electrode connected to the first power source voltage ELVDD, and a second electrode connected to a first electrode of the sixth unit transistor M26. The sixth unit transistor M26 includes a gate electrode connected to the third node N13, a first electrode connected to the second electrode of the fifth unit transistor M25, and a second electrode connected to the third organic light emitting diode B-OLED. The first unit transistor M21 to the sixth unit transistor M26 are turned on by a voltage of the third node N13, and form three current paths between the first power source voltage ELVDD and the third organic light emitting diode B-OLED. In this case, the first to sixth unit transistors M21 to M26 control a driving current flowing from the first power source voltage ELVDD to the third organic light emitting diode B-OLED. In other words, the first unit transistor M21 and the second unit transistor M22 form a first current path between the first power source voltage ELVDD and the third organic light emitting diode B-OLED, the third unit transistor M23 and the fourth unit transistor M24 form a second current path between the first power source voltage ELVDD and the third organic light emitting diode B-OLED, and the fifth unit transistor M25 and the sixth unit transistor M26 form a third current path between the first power source voltage ELVDD and the third organic light emitting diode B-OLED.

A width and length of channels of each of the first unit transistor M21 to the sixth unit transistor M26 are equal, and the first unit transistor M21 to the sixth unit transistor M26 have substantially equivalent characteristics.

The third organic light emitting diode B-OLED includes an anode electrode connected to the third driving transistor M2B and a cathode electrode connected to the second power source voltage ELVSS. The third organic light emitting diode B-OLED may emit blue light when a driving current flows through the third driving transistor M2B.

The switching transistor M1 and the third driving transistor M2B may be oxide thin film transistors. The switching transistor M1 and the third driving transistor M2B may be p-channel field effect transistors. In addition, at least one of the switching transistor M1 and the third driving transistor M2B may be an n-channel field effect transistor.

As described above in FIGS. 2 to 4, the first driving transistor M2R, the second driving transistor M2G, and the third driving transistor M2B included each of the first pixel PXR, the second pixel PXG, and the third pixel PXB may include a different number of unit transistors. For example, the first driving transistor M2R may include two unit transistors, the second driving transistor M2G may include four unit transistors, and the third driving transistor M2B may include six unit transistors. However, the number and connection forms of unit transistors included in each of the first driving transistor M2R, the second driving transistor M2G, and the third driving transistor M2B may be variously changed.

Hereinafter, referring to FIGS. 5 to 8, the switching transistor M1 and the first to third driving transistors M2R, M2G, and M2B including the unit transistors will be described.

It is exemplified that the switching transistor M1 and the first to third driving transistors M2R, M2G, and M2B are oxide thin film transistors.

Figure 5:
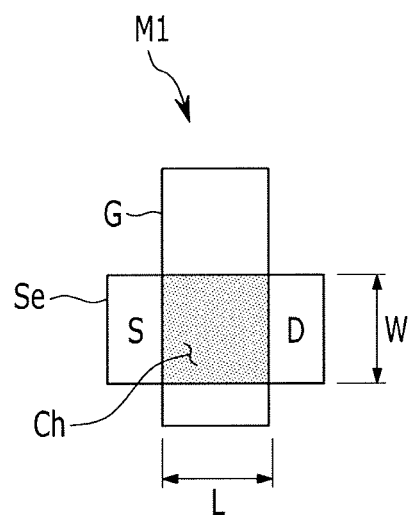
FIG. 5 illustrates a switching transistor included in the first to third pixels of FIGS. 2-4 according to an exemplary embodiment of the present invention.
Figure 6:
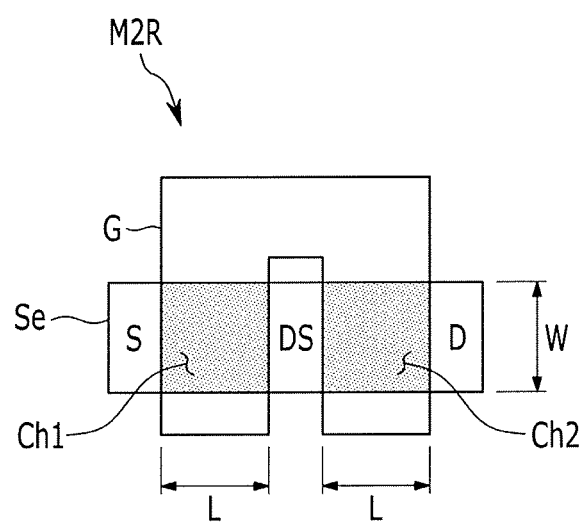
FIG. 6 illustrates a driving transistor included in the first pixel of FIG. 2 according to an exemplary embodiment of the present invention.
Figure 7:
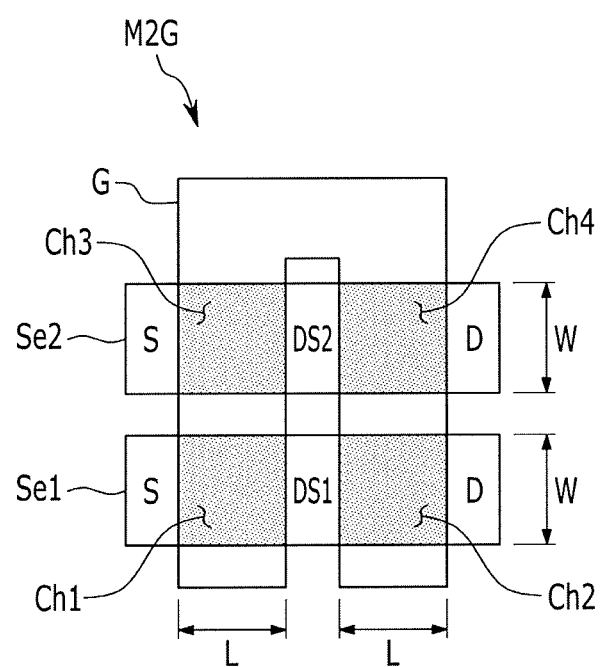
FIG. 7 illustrates a driving transistor included in the second pixel of FIG. 3 according to an exemplary embodiment of the present invention.
Figure 8:
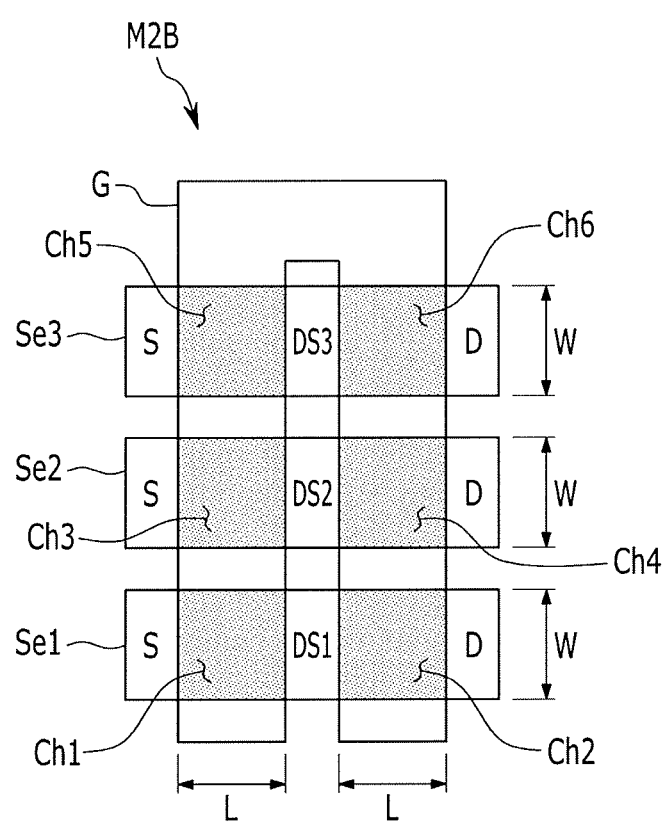
FIG. 8 illustrates a driving transistor included in the third pixel of FIG. 4 according to an exemplary embodiment of the present invention.

FIG. 5 illustrates a switching transistor included in the first to third pixels of FIGS. 2 to 4 according to an exemplary embodiment of the present invention. FIG. 6 illustrates a driving transistor included in the first pixel of FIG. 2 according to an exemplary embodiment of the present invention. FIG. 7 illustrates a driving transistor included in the second pixel of FIG. 3 according to an exemplary embodiment of the present invention. FIG. 8 illustrates a driving transistor included in the third pixel of FIG. 4 according to an exemplary embodiment of the present invention.

First, an oxide thin film transistor is briefly described. A gate electrode G and an oxide semiconductor layer Se of the oxide thin film transistor are overlapped, and are separated from each other with an insulation layer therebetween. An impurity is doped at both sides of the oxide semiconductor layer Se, and a source electrode S and a drain electrode D are formed. The impurity may include an N-type or P-type impurity according to a type of an oxide thin film transistor. A region of which the gate electrode G and the oxide semiconductor layer Se are overlapped is a channel Ch of the oxide thin film transistor. The oxide thin film transistor may be formed as a top-gate type, wherein the gate electrode G is disposed above the oxide semiconductor layer Se. In addition, the oxide thin film transistor may be formed as a bottom-gate type, wherein the gate electrode G is disposed below the oxide semiconductor layer Se.

Referring to FIG. 5, the switching transistor M1 is a unit transistor, and a channel Ch where the gate electrode G and the oxide semiconductor layer Se are overlapped has a unit width W and a unit length L. For example, the unit width W of the channel Ch may be 7 um, and the unit length L of the channel Ch may be 7 μm.

Referring to FIG. 6, a gate electrode G of the first driving transistor M2R is divided into two parts, and overlaps a semiconductor layer Se and forms two channels Ch1 and C2. Each of the first channel Ch1 and the second channel Ch2 has the unit width W and the unit length L.

The first channel Ch1 is a channel of the first unit transistor (referring to M21 of FIG. 2), and the second channel Ch2 is a channel of the second unit transistor (referring to M22 of FIG. 2). An area between the first channel Ch1 and the second channel Ch2 is a drain electrode of the first unit transistor M21 and a source electrode of the second unit transistor M22.

In other words, a gate electrode G, a source electrode S of a first side of the first channel Ch1, a drain electrode (D of DS) of a second side of the first channel Ch1, and the first channel Ch1 form the first unit transistor M21. A gate electrode G, a source electrode (S of DS) of a first side of the second channel Ch2, a drain electrode D of a second side of the second channel Ch2, and the second channel Ch2 form the second unit transistor M22.

Referring to FIG. 7, a gate electrode G of the second driving transistor M2G is divided into two parts, overlaps two semiconductor layers Se1 and Se2, and forms four channels Ch1, Ch2, Ch3, and C4. The first semiconductor layer Se1 and the second semiconductor layer Se2 may be disposed on a same plane. Each of the first to fourth channels Ch1, Ch2, Ch3, and Ch4 has the unit width W and the unit length L.

The first channel Ch1 is a channel of the first unit transistor (referring to M21 of FIG. 3), the second channel Ch2 is a channel of the second unit transistor (referring to M22 of FIG. 3), the third channel Ch3 is a channel of the third unit transistor (referring to M23 of FIG. 3), and the fourth channel Ch4 is a channel of the fourth unit transistor (referring to M24 of FIG. 3)

An area between the first channel Ch1 and the second channel Ch2 is a drain electrode of the first unit transistor M21 and a source electrode of the second unit transistor M22. An area between the third channel Ch3 and the fourth channel Ch4 is a drain electrode of the third unit transistor M23 and a source electrode of the fourth unit transistor M24.

In other words, a gate electrode G, a source electrode S of a first side of the first channel Ch1, a drain electrode (D of DS1) of a second side of the first channel Ch1, and the first channel Ch1 form the first unit transistor M21. A gate electrode G, a source electrode (S of DS1) of a first side of the second channel Ch2, a drain electrode D of a second side of the second channel Ch2, and the second channel Ch2 form the second unit transistor M22. A gate electrode G, a source electrode S of a first side of the third channel Ch3, a drain electrode (D of DS2) of a second side of the third channel Ch3, and the third channel Ch3 form the third unit transistor M23. A gate electrode G, a source electrode (S of DS2) of a first side of the fourth channel Ch4, a drain electrode D of a second side of the fourth channel Ch4, and the fourth channel Ch4 form the fourth unit transistor M24.

Referring to FIG. 8, a gate electrode G of the third driving transistor M2B is divided into three parts, and overlaps three semiconductor layers Se1, Se2, and Se3, and forms six channels Ch1, Ch2, Ch3, Ch4, Ch5, and Ch6. The first semiconductor layer Se1, the second semiconductor layer Se2, and the third semiconductor layer Se3 may be disposed on a same plane. Each of the first to sixth channels Ch1, Ch2, Ch3, Ch4, Ch5, and Ch6 has the unit width W and the unit length L.

The first channel Ch1 is a channel of the first unit transistor (referring to M21 of FIG. 4), the second channel Ch2 is a channel of the second unit transistor (referring to M22 of FIG. 4), the third channel Ch3 is a channel of the third unit transistor (referring to M23 of FIG. 4), the fourth channel Ch4 is a channel of the fourth unit transistor (referring to M24 of FIG. 4), the fifth channel Ch5 is a channel of the fifth unit transistor (referring to M25 of FIG. 4), and the sixth channel Ch6 is a channel of the sixth unit transistor (referring to M26 of FIG. 4). An area between the first channel Ch1 and the second channel Ch2 is a drain electrode of the first unit transistor M21 and a source electrode of the second unit transistor M22. An area between the third channel Ch3 and the fourth channel Ch4 is a drain electrode of the third unit transistor M23 and a source electrode of the fourth unit transistor M24. An area between the fifth channel Ch5 and the sixth channel Ch6 is a drain electrode of the fifth unit transistor M25 and a source electrode of the sixth unit transistor M26.

In other words, a gate electrode G, a source electrode S of a first side of the first channel Ch1, a drain electrode (D of DS1) of a second side of the first channel Ch1, and the first channel Ch1 form the first unit transistor M21. A gate electrode G, a source electrode (S of DS1) of a first side of the second channel Ch2, a drain electrode D of a second side of the second channel Ch2, and the second channel Ch2 form the second unit transistor M22. A gate electrode G, a source electrode S of a first side of the third channel Ch3, a drain electrode (D of DS2) of a second side of the third channel Ch3, and the third channel Ch3 form the third unit transistor M23. A gate electrode G, a source electrode (S of DS2) of a first side of the fourth channel Ch4, a drain electrode D of a second side of the fourth channel Ch4, and the fourth channel Ch4 form the fourth unit transistor M24. A gate electrode G, a source electrode S of a first side of the fifth channel Ch5, a drain electrode (D of DS3) of a second side of the fifth channel Ch5, and the fifth channel Ch5 form the fifth unit transistor M25. A gate electrode G, a source electrode (S of DS3) of a first side of the sixth channel Ch6, a drain electrode D of a second side of the sixth channel Ch6, and the sixth channel Ch6 form the sixth unit transistor M26.

As described above, since the switching transistor M1 and the driving transistors M2R, M2G, and M2B included in a plurality of pixels are formed by a plurality of unit transistors having the unit width W and the unit length L, it is possible to suppress their characteristic changes of threshold voltages, mobility, etc. according to a channel size.

If the driving transistors M2R, M2G, and M2B are not formed by the plurality of unit transistors having the unit width W and the unit length L, but are formed by transistors having different channel sizes from each other, a characteristic deviation of the driving transistors M2R, M2G, and M2B is increased, and display quality of a display device can be deteriorated.

Test results of a characteristic deviation of the driving transistors M2R, M2G, and M2B when the driving transistors M2R, M2G, and M2B are formed by a plurality of unit transistors having the unit width W and the unit length L, and when the driving transistors M2R, M2G, and M2B are formed by one transistor having different channel sizes from each other, will be described in FIGS. 9 to 12.

Figure 9:
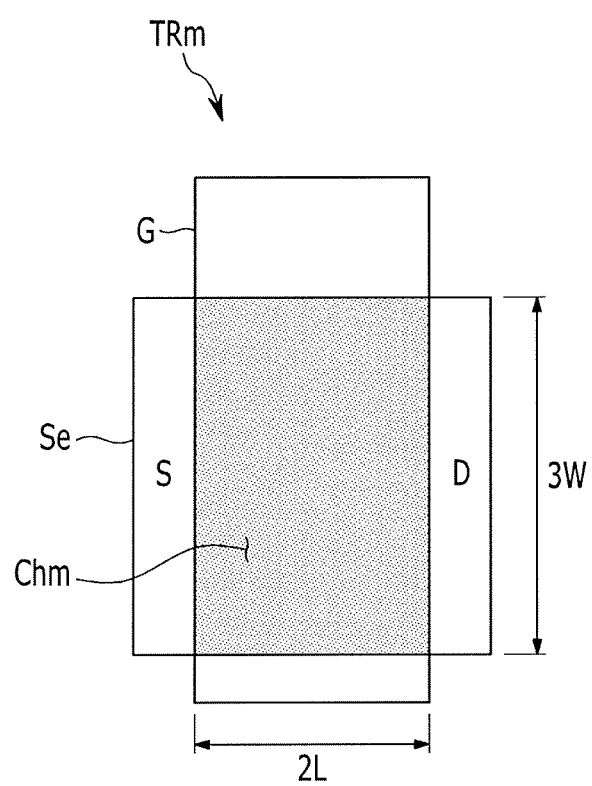
FIG. 9 illustrates a driving transistor according to a comparative example.
Figure 10:
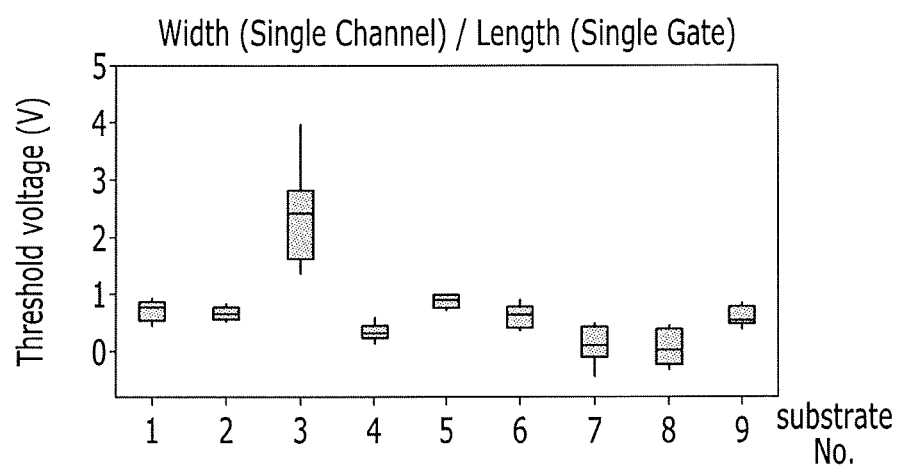
FIG. 10 illustrates a result of an experiment measuring a distribution of a threshold voltage of a plurality of unit transistors in a plurality of display substrates.
Figure 11:
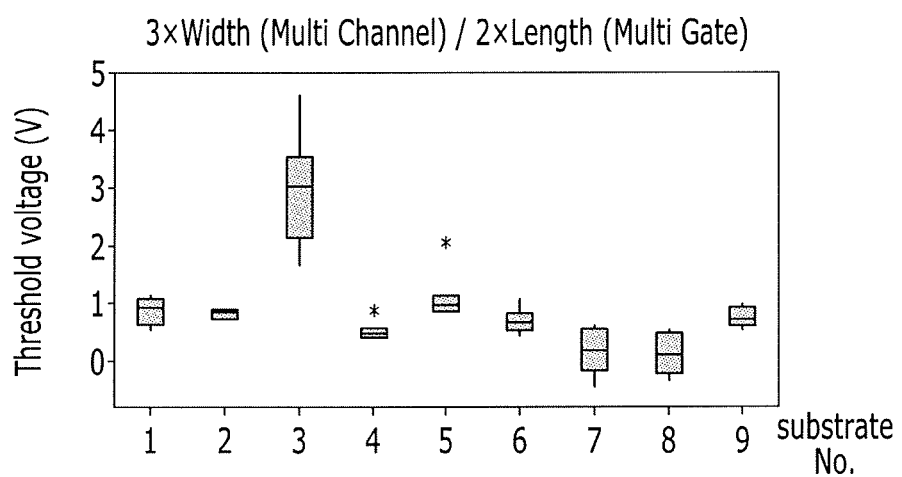
FIG. 11 illustrates a result of an experiment measuring a distribution of a threshold voltage of a plurality of multi-transistors in the plurality of display substrates of FIG. 10.
Figure 12:
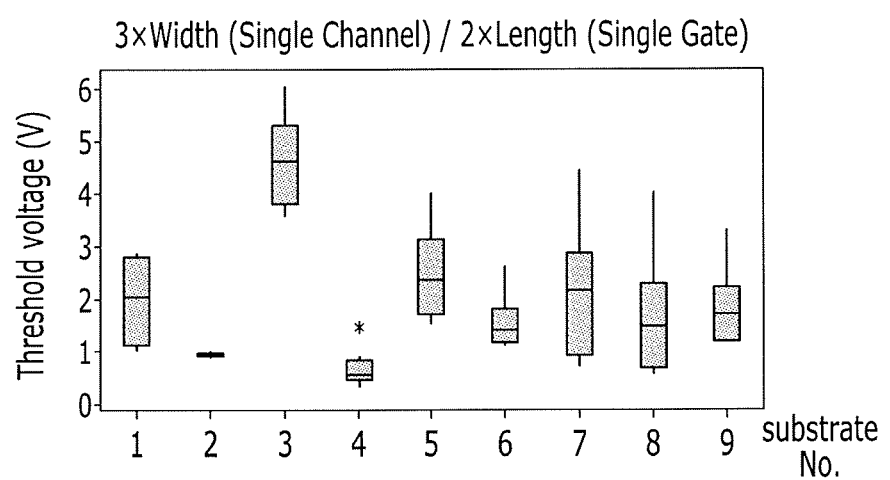
FIG. 12 illustrates a result of an experiment measuring a distribution of a threshold voltage of a plurality of single-transistors in the plurality of display substrates of FIG. 10.

FIG. 9 illustrates a driving transistor according to a comparative example. FIG. 10 illustrates a result of an experiment measuring a distribution of a threshold voltage of a plurality of unit transistors in a plurality of display substrates. FIG. 11 illustrates a result of an experiment measuring a distribution of a threshold voltage of a plurality of multi-transistors in the plurality of display substrates of FIG. 10. FIG. 12 illustrates a result of an experiment measuring a distribution of a threshold voltage of a plurality of single-transistors in the plurality of display substrates of FIG. 10.

A driving transistor TRm of the comparative example in FIG. 9 includes a channel Chm, wherein the width 3W of the channel Chm is 3 times larger than the unit width W (refer to FIGS. 5-8), and the length 2L of the channel Chm is 2 times larger than the unit length L (refer to FIGS. 5-8). The channel size of the driving transistor TRm of the comparative example is the same as a sum of channel sizes of 6 channels Ch1, Ch2, Ch3, Ch4, Ch5, and Ch6 of the third driving transistor M2B in FIG. 8. In FIG. 9, G refers to a gate, S refers to a source and D refers to a drain of the driving transistor TRm.

A unit transistor having a unit channel, a multi-transistor having six channels like the third driving transistor M2B of FIG. 8, and a single-transistor like the driving transistor TRm of the comparative example of FIG. 9 are formed on a plurality of display substrates, and then each transistor's threshold voltage distribution is measured. In this case, the width and length of the unit channel is 7 um. The single transistor like the driving transistor TRm of the comparative example of FIG. 9 has a channel that is 6 (=2×3) times the size of the unit channel.

The distribution of the threshold voltage of the unit transistor for each substrate of FIG. 10 and the distribution of the threshold voltage of the multi-transistor for each substrate of FIG. 11 are very similar. In other words, the characteristic of the threshold voltage of the multi-transistor including a plurality of unit transistors is very similar to the characteristic of the threshold voltage of the unit transistor. This means that currents flowing through the multi-transistor according to a gate voltage applied to a gate electrode of the multi-transistor are very similar to currents flowing though the unit transistor according to the gate voltage applied to a gate electrode of the unit transistor.

Therefore, the multi-transistor including a plurality of unit transistors has very similar characteristics to the characteristics of the unit transistor. In other words, the first driving transistor M2R of the first pixel PXR, the second driving transistor M2G of the second pixel PXG, and the third driving transistor M2B of the third pixel PXB have very similar characteristics.

The distribution of the threshold voltage of the single-transistor for each substrate of FIG. 12 is different from the distribution of the threshold voltage of the unit transistor for each substrate of FIG. 10 and the distribution of the threshold voltage of the multi-transistor for each substrate of FIG. 11. In addition, the distribution of the threshold voltage of the single-transistor for each substrate of FIG. 12 is relatively larger that the threshold voltage distribution of the unit transistor for each substrate of FIG. 10 and the distribution of the threshold voltage of the multi-transistor for each substrate of FIG. 11.

As described above in accordance with an exemplary embodiment of the present invention, since the first to third driving transistors M2R, M2G, and M2B are formed in the multi-transistor including a plurality of unit transistors, the first to third driving transistors M2R, M2G, and M2B may have similar characteristics.

Hereinafter, referring to FIGS. 13 to 17, a display device according to an exemplary embodiment of the present invention will be described. The description focuses on differences from the display device according to an exemplary embodiment of the present invention described above.

Figure 13:
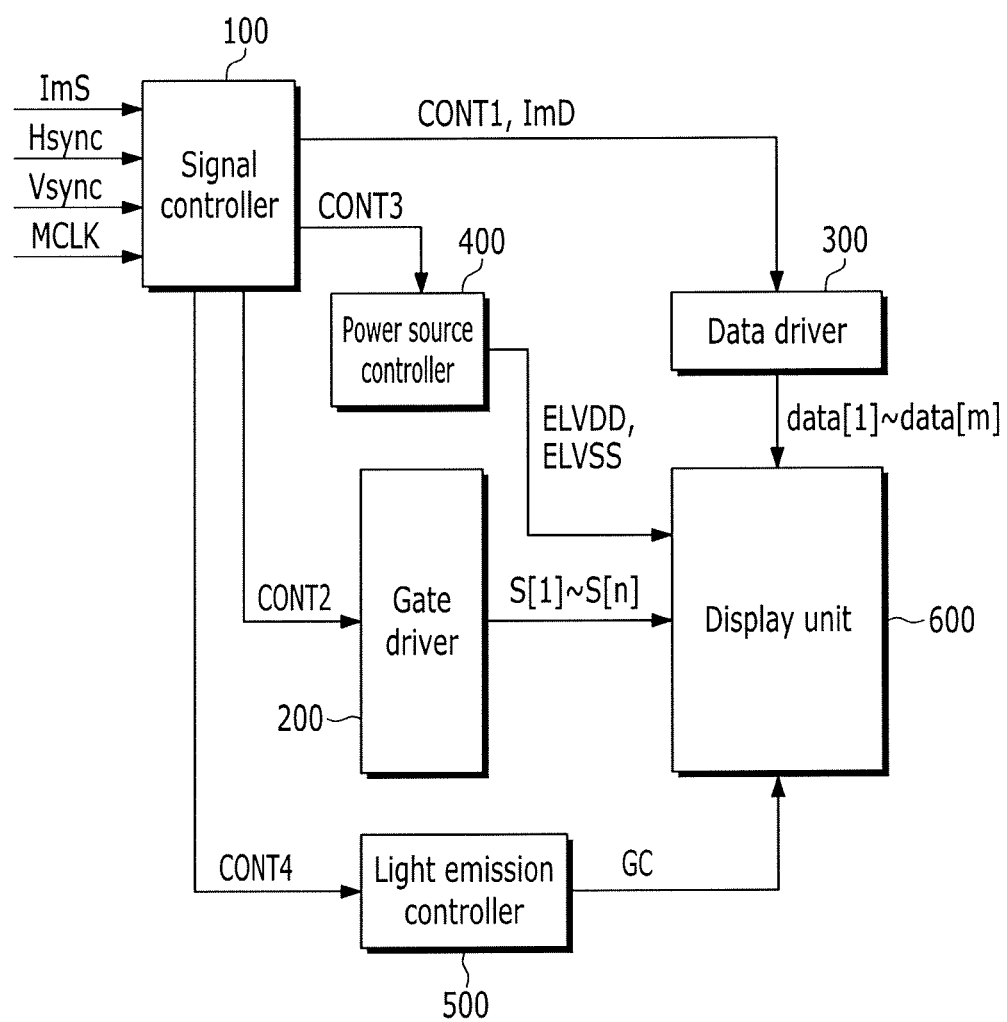
FIG. 13 illustrates a display device according to an exemplary embodiment of the present invention.

FIG. 13 illustrates a display device according to an exemplary embodiment of the present invention.

Referring to FIG. 13, in addition to that shown in FIG. 1, the display device includes a light emission controller 500.

The signal controller 100 further generates a fourth driving control signal CONT4, and transmits the fourth driving control signal CONT4 to the light emission controller 500.

The light emission controller 500 generates light emission control signals GC according to the fourth driving control signal CONT4. The light emission controller 500 is connected to a plurality of light emitting lines included in the display unit 600, and applies the light emission control signals GC simultaneously or sequentially to the plurality of light emitting lines.

Figure 14:
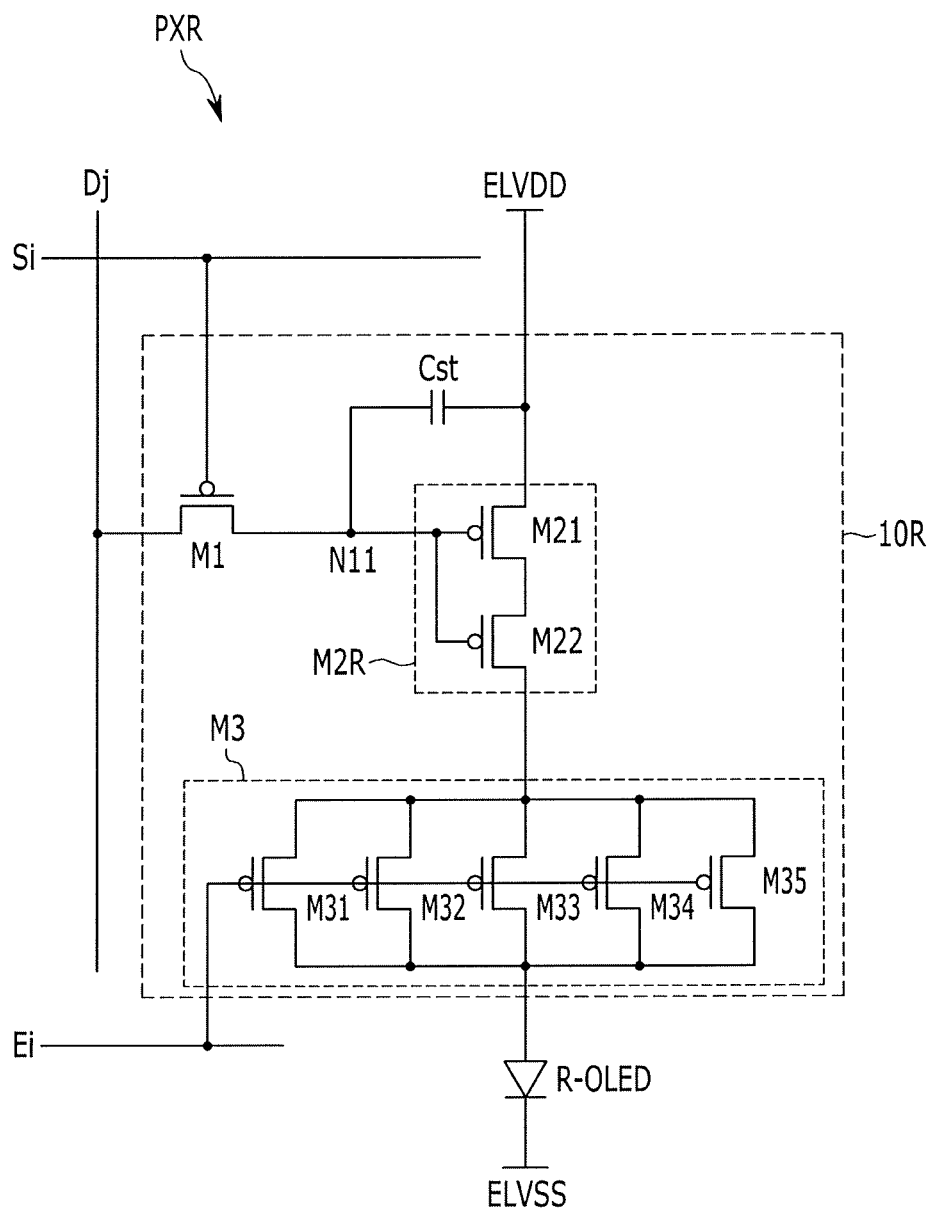
FIG. 14 illustrates a first pixel included in the display device of FIG. 13 according to an exemplary embodiment of the present invention.
Figure 15:
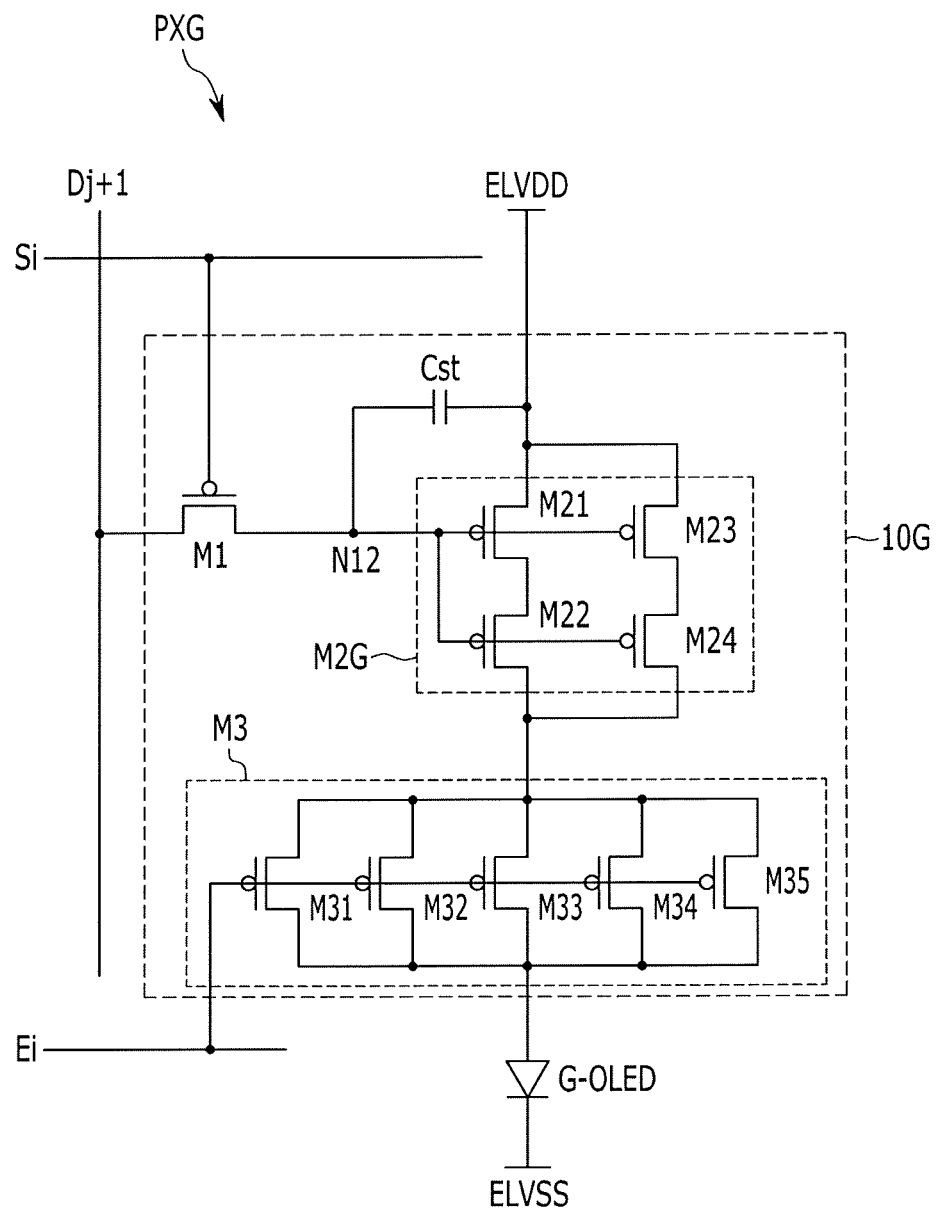
FIG. 15 illustrates a second pixel included in the display device of FIG. 13 according to an exemplary embodiment of the present invention.
Figure 16:
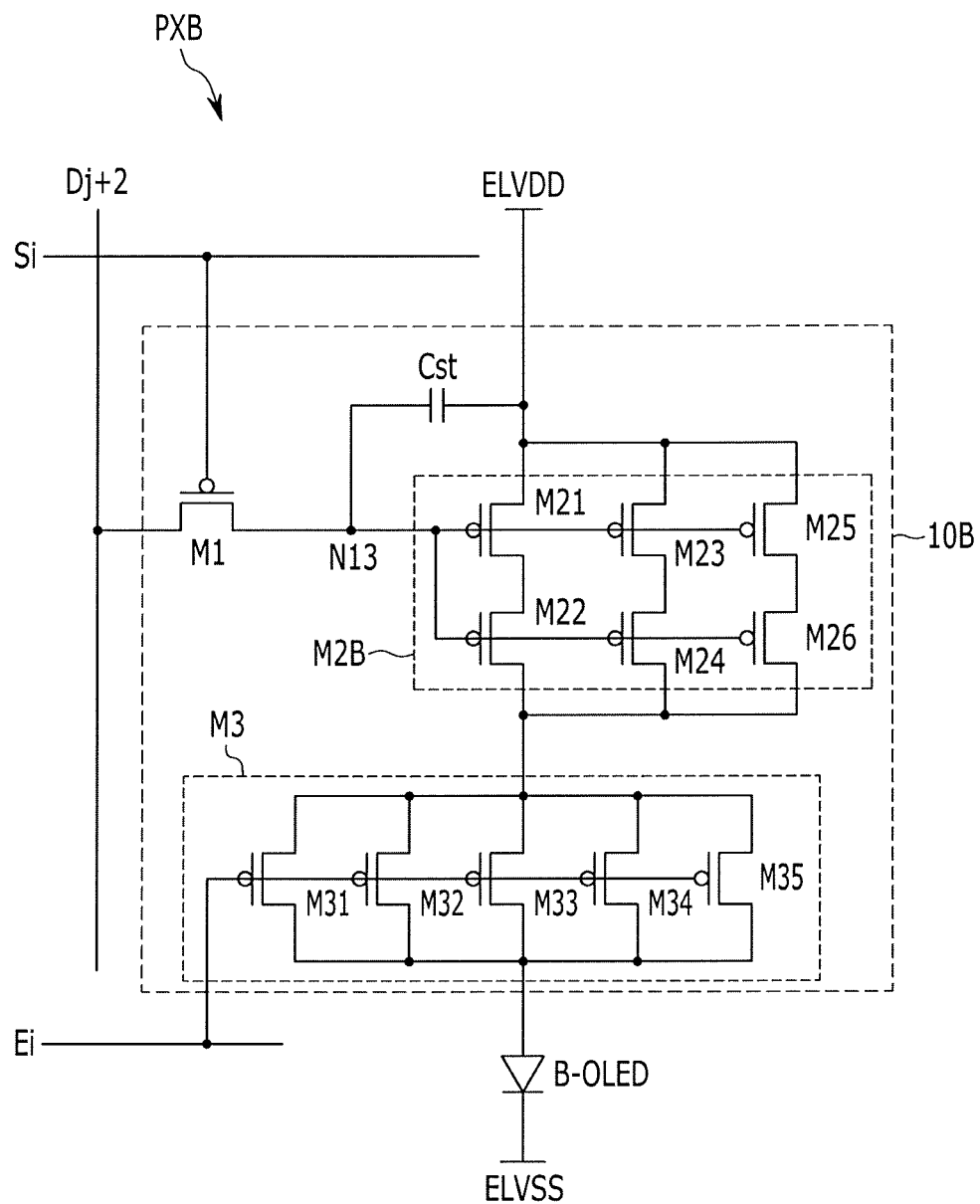
FIG. 16 illustrates a third pixel included in the display device of FIG. 13 according to an exemplary embodiment of the present invention.

FIG. 14 illustrates a first pixel included in the display device of FIG. 13 according to an exemplary embodiment of the present invention. FIG. 15 illustrates a second pixel included in the display device of FIG. 13 according to an exemplary embodiment of the present invention. FIG. 16 illustrates a third pixel included in the display device of FIG. 13 according to an exemplary embodiment of the present invention.

Referring to FIGS. 14 to 16, the pixel circuits 10R, 10G, and 10B of each of the first pixel PXR, the second pixel PXG, and the third pixel PXB shown in FIGS. 2-4 further include a light emitting transistor M3. The light emitting transistor M3 may be formed the same in each of the first to third pixels PXR, PXG, and PXB.

The light emitting transistor M3 includes five unit light emitting transistors M31, M32, M33, M34, and M35 which have gate electrodes connected to a light emitting line Ei. Each of the first to fifth unit light emitting transistors M31, M32, M33, M34, and M35 includes a gate electrode connected to the light emitting line Ei, a first electrode connected to the driving transistors M2R, M2G, and M2B, and a second electrode connected to the organic light emitting diodes R-OLED, G-OLED, and B-OLED.

The light emitting transistor M3 is turned on by a gate-on voltage of the light emission control signal GC applied to the light emitting line Ei, and the driving current flows to the organic light emitting diodes R-OLED, G-OLED, and B-OLED through five current paths of the five unit light emitting transistors M31, M32, M33, M34, and M35.

The light emitting transistor M3 may be an oxide thin film transistor. The light emitting transistor M3 may be a p-channel field effect transistor. In addition, the light emitting transistor M3 may be an n-channel field effect transistor.

Figure 17:
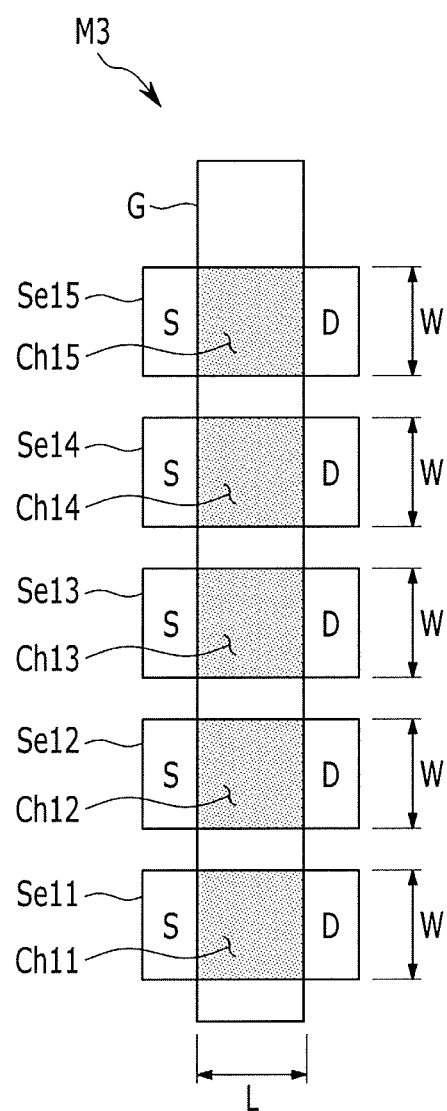
FIG. 17 illustrates a light emitting transistor included in the first to third pixels of FIGS. 14-16 according to an exemplary embodiment of the present invention.

FIG. 17 illustrates a light emitting transistor included in the first to third pixels of FIGS. 14-16 according to an exemplary embodiment of the present invention.

Referring to FIG. 17, a gate electrode G of the light emitting transistor M3 overlaps five semiconductor layers Se11, Se12, Se13, Se14, and Se15, and forms five channels Ch11 to C15. The first to five semiconductor layers Se11, Se12, Se13, Se14, and Se15 may be disposed on the same plane. Each of the first to fifth channels Ch11, Ch12, Ch13, Ch14, and Ch15 has the unit width W and the unit length L. In FIG. 17, S refers to sources and D refers to drains of the light emitting transistor.

The first channel Ch11 is a channel of the first unit light emitting transistor (referring to M31 of FIGS. 14 to 16), the second channel Ch12 is a channel of the second unit light emitting transistor (referring to M32 of FIGS. 14 to 16), the third channel Ch13 is a channel of the third unit light emitting transistor (referring to M33 of FIGS. 14 to 16), the fourth channel Ch14 is a channel of the fourth unit light emitting transistor (referring to M34 of FIGS. 14 to 16), and the fifth channel Ch15 is a channel of the fifth unit light emitting transistor (referring to M35 of FIGS. 14 to 16). The light emitting transistor M3 forms five current paths by five channels Ch11, Ch12, Ch13, Ch14, and Ch15.

Since the light emitting transistor M3 is formed by the plurality of unit light emitting transistors M31, M32, M33, M34, and M35 having channels of a predetermined width and length, the light emitting transistor M3 may have similar characteristics of threshold, mobility, etc. to the switching transistor M1 and the driving transistors M2R, M2G, and M2B.

In a display device according to an exemplary embodiment of the present invention, a characteristic deviation of oxide thin film transistors can be reduced, and thus, the faultiness of products resulting from the characteristic deviation of oxide thin film transistors can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
a plurality of pixels including:
a first pixel including a first organic light emitting diode and a first driving transistor, which includes a first semiconductor layer and a first gate electrode divided into two parts overlapping the first semiconductor layer, for controlling a first driving current flowing to the first organic light emitting diode, wherein a first channel formed by overlapping a first part of the first gate electrode and the first semiconductor layer has a first width and a first length equal to the first width and a second channel formed by overlapping a second part of the first gate electrode and the first semiconductor layer has the first width and the first length;
a second pixel including a second organic light emitting diode and a second driving transistor, which includes two second semiconductor layers and a second gate electrode divided into two parts that extend lengthwise in a first direction and overlap the two second semiconductor layers, for controlling a second driving current flowing to the second organic light emitting diode; and
a third pixel including a third organic light emitting diode and a third driving transistor, which includes three third semiconductor layers and a third gate electrode divided into two parts that extend lengthwise in the first direction and overlap the three third semiconductor layers, for controlling a third driving current flowing to the third organic light emitting diode,
wherein the plurality of pixels include different numbers of unit transistors according to colors of the pixels,
wherein the first pixel includes a first light emitting transistor between the first driving transistor and the first organic light emitting diode and transmitting the first driving current to the first organic light emitting diode,
wherein the second pixel includes a second light emitting transistor between the second driving transistor and the second organic light emitting diode and transmitting the second driving current to the second organic light emitting diode,
wherein the third pixel includes a third light emitting transistor between the third driving transistor and the third organic light emitting diode and transmitting the third driving current to the third organic light emitting diode, and
wherein each of the first light emitting transistor, the second light emitting transistor, and the third light emitting transistor includes a plurality of transistors connected in parallel, the same number of transistors are included in the first light emitting transistor, the second light emitting transistor and the third light emitting transistor.

2. The display device of claim 1, wherein the first driving transistor includes two unit transistors each including a gate electrode connected to a first node, the two unit transistors included in the first driving transistor form one current path between the first power source voltage and the first organic light emitting diode.

3. The display device of claim 2, wherein the first pixel further includes a switching transistor for transmitting a data voltage to the first node, and the switching transistor includes one unit transistor.

4. The display device of claim 1, wherein the second driving transistor includes four unit transistors each including a gate electrode connected to a second node, the four unit transistors included in the second driving transistor form two current paths between a first power source voltage and the second organic light emitting diode, the second pixel further includes a switching transistor for transmitting a data voltage to the second node, and the switching transistor includes one unit transistor.

5. The display device of claim 1, wherein the third driving transistor includes six unit transistors each including a gate electrode connected to a third node, the six unit transistors included in the third driving transistor form three current paths between a first power source voltage and the third organic light emitting diode, first and second unit transistors of the six unit transistors form a third current path between the first power source voltage and the third organic light emitting diode, third and fourth unit transistors of the six unit transistors form a fourth current path between the first power source voltage and the third organic light emitting diode, and fifth and sixth unit transistors of the six unit transistors form a fifth current path between the first power source voltage and the third organic light emitting diode.

6. The display device of claim 5, wherein the third pixel further includes a switching transistor for transmitting a data voltage to the third node, and the switching transistor includes one unit transistor.

7. The display device of claim 1, wherein the first organic light emitting diode emits red light, the second organic light emitting diode emits green light, and the third organic light emitting diode emits blue light.

8. The display device of claim 1, wherein each of the light emitting transistors includes five unit transistors each including a gate electrode applied a light emission control signal.

9. The display device of claim 8, wherein the five unit transistors form five current paths.

10. The display device of claim 1, wherein at least one of the unit transistors is an oxide thin film transistor.

11. The display device of claim 1, wherein at least one of the first driving transistor, the second driving transistor, the third driving transistor, and the light emitting transistor is a p-channel field effect transistor.

12. A display device, comprising:
a plurality of pixels including:
a first pixel including a first light emitting element and a first driving transistor, which includes a first semiconductor layer and a first gate electrode divided into two parts overlapping the first semiconductor layer and forming two channels, for providing a driving current to the first light emitting element, wherein each of the two channels has a first width and a first length;
a second pixel including a second light emitting element and a second driving transistor, which includes two second semiconductor layers and a second gate electrode divided into two parts overlapping the two second semiconductor layers and forming four channels, for providing a driving current to the second light emitting element, wherein each of the four channels has a second width and a second length; and
a third pixel including a third light emitting element and a third driving transistor, which includes three third semiconductor layers and a third gate electrode divided into two parts overlapping the three third semiconductor layers and forming six channels, for providing a driving current to the third light emitting element, wherein each of the six channels has a third width and a third length,
wherein the first, second and third widths are the same as each other, the first, second and third lengths are the same as each other and the first width is equal to the first length, the second width is equal to the second length and the third width is equal to the third length,
wherein the plurality of pixels include different numbers of unit transistors according to colors of the pixels,
wherein the first pixel includes a first light emitting transistor between the first driving transistor and the first organic light emitting diode and transmitting the first driving current to the first organic light emitting diode,
wherein the second pixel includes a second light emitting transistor between the second driving transistor and the second organic light emitting diode and transmitting the second driving current to the second organic light emitting diode,
wherein the third pixel includes a third light emitting transistor between the third driving transistor and the third organic light emitting diode and transmitting the third driving current to the third organic light emitting diode, and
wherein each of the first light emitting transistor, the second light emitting transistor, and the third light emitting transistor includes a plurality of transistors connected in parallel, the same number of transistors are included in the first light emitting transistor, the second light emitting transistor and the third light emitting transistor.

* * * * *